US006160451A

United States Patent [19]

Floru

[11] Patent Number: 6,160,451

[45] Date of Patent: Dec. 12, 2000

[54] OPERATIONAL AMPLIFIER OUTPUT STAGE

[75] Inventor: Fred Floru, Needham, Mass.

[73] Assignee: THAT Corporation, Milford, Mass.

[21] Appl. No.: 09/293,033

[22] Filed: Apr. 16, 1999

[51] Int. Cl.[7] .......... H03F 3/18

[52] U.S. Cl. .......... 330/263; 330/267

[58] Field of Search .......... 330/263, 267, 330/310, 311, 268, 273, 274

[56] References Cited

U.S. PATENT DOCUMENTS

| | | | |
|---|---|---|---|
| 5,323,122 | 6/1994 | Bowers | 330/263 |
| 5,589,798 | 12/1996 | Harvey | 330/263 |
| 5,614,866 | 3/1997 | Dow | 330/267 |

*Primary Examiner*—Benny Lee
*Assistant Examiner*—Henry Choe
*Attorney, Agent, or Firm*—McDermott, Will & Emery

[57] ABSTRACT

The present invention is directed to a buffer stage for buffering and isolating a signal source from an external load. The stage has a signal input terminal for receiving an input signal from said signal source and a signal output terminal for providing an output signal, corresponding to said input signal, to the external load. The stage comprises an input section including at least two driver transistors each arranged so as to operate with a predetermined bias current. The stage further comprises an output section including at least two output transistors each arranged so as to operate with a predetermined quiescent current, and a voltage source, coupled to the input and output sections and constructed and arranged so as to set the quiescent currents flowing through the output transistors substantially independent of the size of the bias current flowing through the driver transistors.

22 Claims, 15 Drawing Sheets

OPERATIONAL AMPLIFIER OUTPUT STAGE

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

FIELD OF THE INVENTION

The present invention relates to an apparatus for and method of buffering and isolating a signal source from an external load, and more particularly to an apparatus for and method of buffering and isolating a signal source from an external load such that the buffering and isolation characteristics are substantially independent of internal bias current source fluctuations, and a voltage source for use therein.

BACKGROUND OF THE INVENTION

In general, the performance of a signal source is dependent upon the characteristics of the external load connected to the output of the signal source. When the external load is known to exhibit variable characteristics, it is often desirable to place a buffer between the output of the signal source and the external load. Such a buffer isolates the signal source from the external load and provides a constant, intermediate load, thus ensuring consistent signal source performance. A buffer also may provide superior drive capability relative to the signal source output. Amplifiers and operational amplifiers are examples of a load dependent signal source. An amplifier or operational amplifier is used to amplify a received signal and apply the amplified signal to an external load. An amplifier or operational amplifier typically includes two or more distinct blocks or stages connected in series. One embodiment of an operational amplifier, shown in FIG. 1, has n gain blocks and one output stage, where n is an integer greater than or equal to one.

There are numerous output stage topologies and classes known in the art. A number of the more common output stage topologies are described herein. In general, a circuit designer seeks to minimize a silicon die size because a smaller die size has better production yields and results in physically smaller end products. Thus, the total area necessary to implement an output stage in silicon is a significant consideration when choosing a particular topology. Therefore, in order to measure each topology, a fair criterion is to compare the relative sizes of certain output stage topologies. Accordingly, in discussing the relative sizes in the following examples, the minimum transistor geometry of a transistor (which is usually defined by the area of its emitter) used in the output stages is defined as having a unit area of 1 x. It is also assumed that the maximum required output current of the output stage is 16 mA.

One output stage topology includes the complementary emitter follower, which uses an NPN transistor and a PNP transistor to drive the load connected to the OUTPUT node, and is shown in FIG. 2. For this example, the output transistors Q1 and Q2 are assumed to each have an area of 8 x (eight times the area of the minimum geometry transistor), the minimum size of each of the input transistor Q3 and current source I1 is 1 x, and the maximum required output current is 16 mA. The maximum base current of transistor Q1 determines the amount of current required from the current source I1. In this example, $$I1 = I_{BQ1MAX} = \frac{I_{outputMAX}}{\beta_{min}} = \frac{16\,\text{mA}}{40} = 400\ \mu\text{A}, \qquad (1)$$

where β is the transistor current gain. Typically, the minimum β at a collector current of 16 mA is around 40. The quiescent current through transistors Q1 and Q2 is preferably on the order of a few hundred μA so as to minimize crossover distortion, thus the quiescent current is similar in magnitude to the bias current (I1) provided by the bias current source I1. For simplicity, assume that the quiescent current is equal to the current I1 provided by the current source. A bias voltage source V1 is connected between the bases of transistors Q1 and Q2 to maintain the quiescent current. Obviously, a battery is not a realistic implementation of the voltage source V1.

As seen in FIG. 3, one embodiment of the voltage source V1 comprises two transistors Q4 and Q5, each connected as a diode and having the same emitter area as transistors Q1 and Q2 so as to provide the necessary voltage of the voltage source V1 of FIG. 3. However, the embodiment shown in FIG. 3 includes four large transistors (Q1=Q2=Q4=Q5=8 x), an input transistor (Q3=1 x) and a current source (I1=1 x) for a total area of 34 x. This arrangement therefore requires a relatively large silicon area to implement in IC form.

In another embodiment of the output stage shown in FIG. 4, the voltage source V1 is in the form of a $V_{BE}$ multiplier, the latter occupying less area than that of transistors Q4 and Q5 shown in the FIG. 3 embodiment. Two common implementations of a $V_{BE}$ multiplier are shown in FIG. 4A and 4B. The silicon area occupied by transistors and current sources for FIGS. 4A and 4B is 19 x and 20 x, respectively, which is a significant reduction as compared to the FIG. 3 embodiment. However, the V1 embodiments shown in FIG. 4A and 4B include resistors R1 and R2 that are in the tens of kΩ range, implementation of which will require from 6 x to 12 x of silicon area.

A disadvantage common to all of the output stage embodiments shown in FIGS. 2 through 4 is that a zero volt output of the stage, which is the normal idle state of an operational amplifier without an input signal, corresponds to approximately −1.3 V input voltage relative to the output voltage. This is necessary in order to properly bias transistors Q2 and Q3. The negative voltage excursion at the output is thus limited to −(|V−|−1.3 V), where V− is the voltage applied to the negative rail.

FIG. 5 illustrates yet another common embodiment of an output stage circuit, which overcomes the output voltage swing limitation of the embodiments shown in FIGS. 2 through 4. However, the embodiment of FIG. 5 overcomes the output voltage swing limitation at the expense of more silicon area (34 x) because all of the transistors must be the same size. Also, the embodiment of FIG. 5 requires an additional current source I2, matching current source I1, in the emitter of transistor Q4.

The 34 x silicon area of the circuit in FIG. 5 can be reduced to 28 x by using Darlington transistor pairs. FIG. 6 shows such a topology where the transistor Q1–Q4 Darlington pair replaces the transistor Q1 of FIG. 5, and the transistor Q2–Q3 Darlington pair replaces the transistor Q2 of FIG. 5. Moreover, the current sources I3 and I4 may already exist within the host operational amplifier, and the output stage could be further reduced to 26 x silicon area.

A variation of the circuit in FIG. 6, shown in FIG. 7, adds two resistors in the collectors of transistors Q7 and Q8, forming two "peaking" current sources, as they are known in the art. The quiescent current of the output stage of the embodiment of FIG. 7, i.e., the collector current of transistors Q1 and Q2, is less dependent on the matching and/or precision of current sources I1, I2, I3 and I4. The values of resistors R1 and R2 are usually small, consequently the silicon area needed is also small. Since both peaking current sources are in series, however, R1 and R2 have to match relatively well.

The Darlington transistor configurations within the embodiments shown in FIGS. 6 and 7 have the advantage of adding a third level of buffering, as compared to FIG. 5, which provides only two levels of buffering. This third level of buffering adds significant isolation between the amplifier and the external load. However, the embodiments of FIGS. 6 and 7 gain the additional isolation at the expense of the maximum voltage swing available at the output of the buffer. While the output of the circuit shown in FIG. 5 exhibits a voltage swing of $\pm(|V_{supply}|-0.85\ V)$, the output voltage of the circuit in FIG. 6 can swing only $\pm(|V_{supply}|-1.5\ V)$, where $|V_{supply}|=|V+|=|V-|$. The output of the circuit in FIG. 7 can swing even less because of the extra voltage drop across resistors R1 and R2.

SUMMARY OF THE INVENTION

The present invention is directed to an apparatus for buffering and isolating a signal source from an external load. The apparatus is in the form of an output stage performing in a similar manner to the prior art device shown in FIG. 5, but using less area.

In accordance with one aspect of the invention, a buffer stage is provided for buffering and isolating a signal source from an external load. The stage has a signal input terminal for receiving an input signal from said signal source and a signal output terminal for providing an output signal, corresponding to said input signal, to said external load, comprising:

- an input section including at least two driver transistors each arranged so as to operate with a predetermined bias current;
- an output section including at least two output transistors each arranged so as to operate with a predetermined quiescent current; and
- a voltage source, coupled to the input and output sections and constructed and arranged so as to set the quiescent currents flowing through the output transistors substantially independent of the size of the bias current flowing through the driver transistors.

In one embodiment, adjusting the voltage provided by the voltage source causes the bias currents through the two driver transistors to be split at different ratios between one path including the voltage source and one driver transistor, and a second path including the voltage source and the other driver transistor.

In one embodiment, the quiescent current through the output transistors is substantially independent of the size of the emitter area of each of the driver transistors so long as the emitter area of each of the driver transistors is smaller than the emitter area of each of the output transistors.

In one embodiment, in operation the sum of the output transistor base-emitter voltages is equal to the sum of the driver transistor base-emitter voltages. And in one embodiment, the difference current between the bias current and the collector current of each of the driver transistors flows through the voltage source.

In one embodiment, the bases of the driver transistors are connected together and form the input of the buffer stage.

In one embodiment, the emitters of the output transistors are connected together and form the output of the buffer stage.

In one embodiment the stage further includes a current source for providing the bias current through each of the driver transistors.

In one embodiment, the emitter of each of the of the driver transistors is coupled to a current source so that at least some of the bias current flows through the driver transistors.

In one embodiment, the voltage source is connected between the emitters of the driver transistors, and between the bases of the output transistors.

In one embodiment, the output transistors are of an opposite conductivity type.

In one embodiment, the voltage source includes two voltage source transistors of an opposite conductivity type, and a resistor connected between the collector of one voltage source transistor and the base of the other voltage source transistor, and between the collector of the other voltage source transistor and the base of the one voltage source transistor.

In one embodiment, the bias currents through the driver transistors are equal.

In accordance with another aspect of the invention, all of the currents of an output stage are largely independent of bias current sources and are controlled from one source, i.e., a voltage source.

In one preferred embodiment the voltage source is controlled by a single resistive element, and ultimately all of the currents in the output stage are controlled by the same resistive element.

In one preferred embodiment, the voltage source for providing all of the currents is a two terminal device having one terminal connected between the output of one driver transistor and the input of one output transistor, and the other terminal connected between the output of a second driver transistor and the input of a second output transistor.

In accordance with another aspect, the apparatus includes a signal input terminal for receiving an input signal from the signal source, and a signal output terminal for providing an output signal, corresponding to the input signal, to the external load. The apparatus comprises two current sources, two driver transistors, two output transistors and a control voltage source. The first current source simultaneously provides an emitter current to the first driver transistor and a bias current to the first output transistor. The second current source simultaneously receives an emitter current from the second driver transistor and a bias current from the second output transistor. The input signal provides bias to both the first driver transistor and the second driver transistor. The output terminal is electrically coupled to both the emitter of the first output transistor and the emitter of the second output transistor. The control voltage source is electrically coupled between the emitter of the first driver transistor and the emitter of the second drive transistor. The current through the control voltage source varies as a predetermined function of the control voltage, such that the quiescent collector currents of the output transistors remain substantially constant regardless of any parametric variations exhibited by the input current sources and/or the driver transistors.

In accordance with one preferred embodiment of the invention, the first driver transistor includes a PNP type transistor, the second driver transistor includes an NPN type transistor, the first output transistor includes an NPN type transistor, and the second output transistor includes a PNP type transistor.

In another embodiment of the invention, a supply voltage source is electrically coupled between the collector of the first output transistor and the collector of the second output transistor.

In another embodiment, the predetermined function includes a substantially exponential relationship.

In yet another embodiment, the control voltage source includes a resistor, a PNP type transistor, and an NPN type transistor. In this embodiment, the resistor is electrically coupled between the collector of the PNP type transistor and the collector of the NPN type transistor. The base of the PNP type transistor is electrically coupled to the collector of the NPN type transistor, the base of the NPN transistor is electrically coupled to the collector of the PNP type transistor, the emitter of the PNP type transistor is electrically coupled to the emitter of the first driver transistor, and the emitter of the NPN type transistor is electrically coupled to the emitter of the second drive transistor.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION OF THE INVENTION

Figure 1:
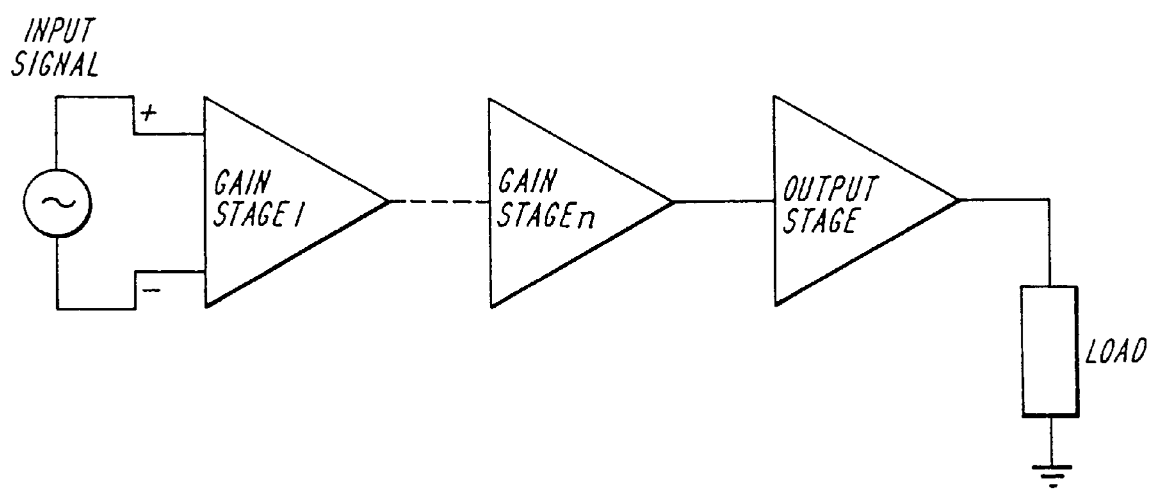
FIG. 1 illustrates a schematic view of a typical prior art operational amplifier.
Figure 2:
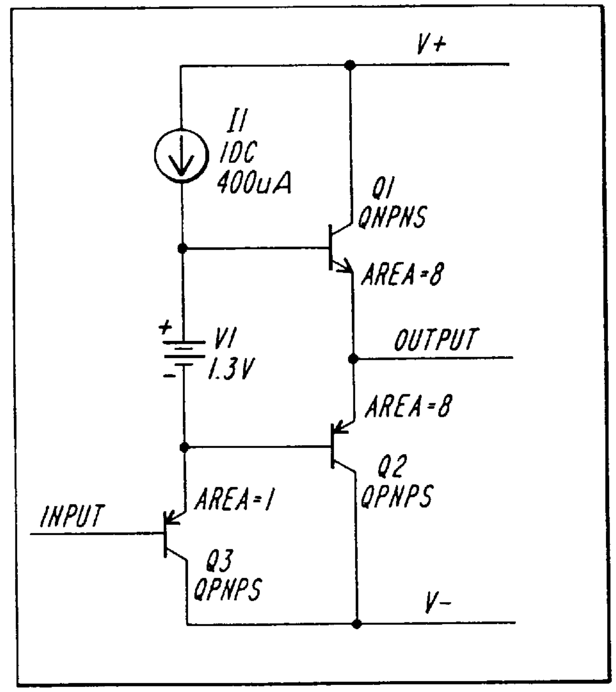
FIG. 2 illustrates a schematic view of a prior art complementary emitter follower output stage architecture.
Figure 3:
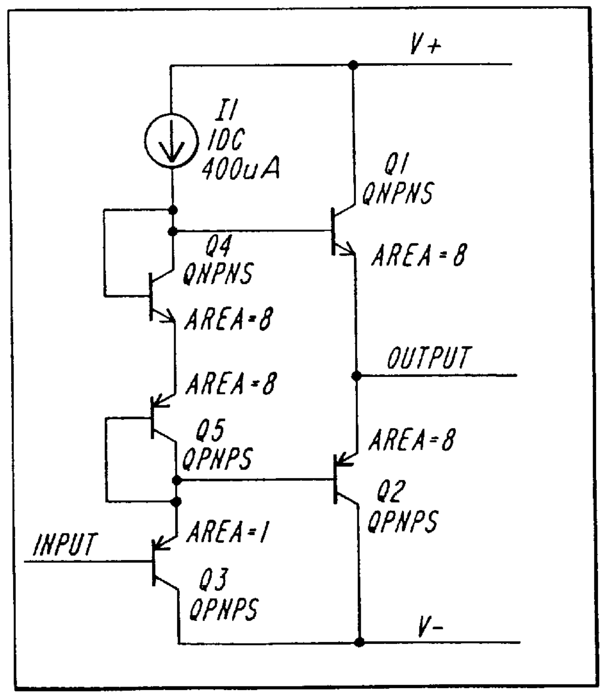
FIG. 3 illustrates a schematic view of a prior art output stage architecture having a common two transistor bias voltage source.
Figure 4:
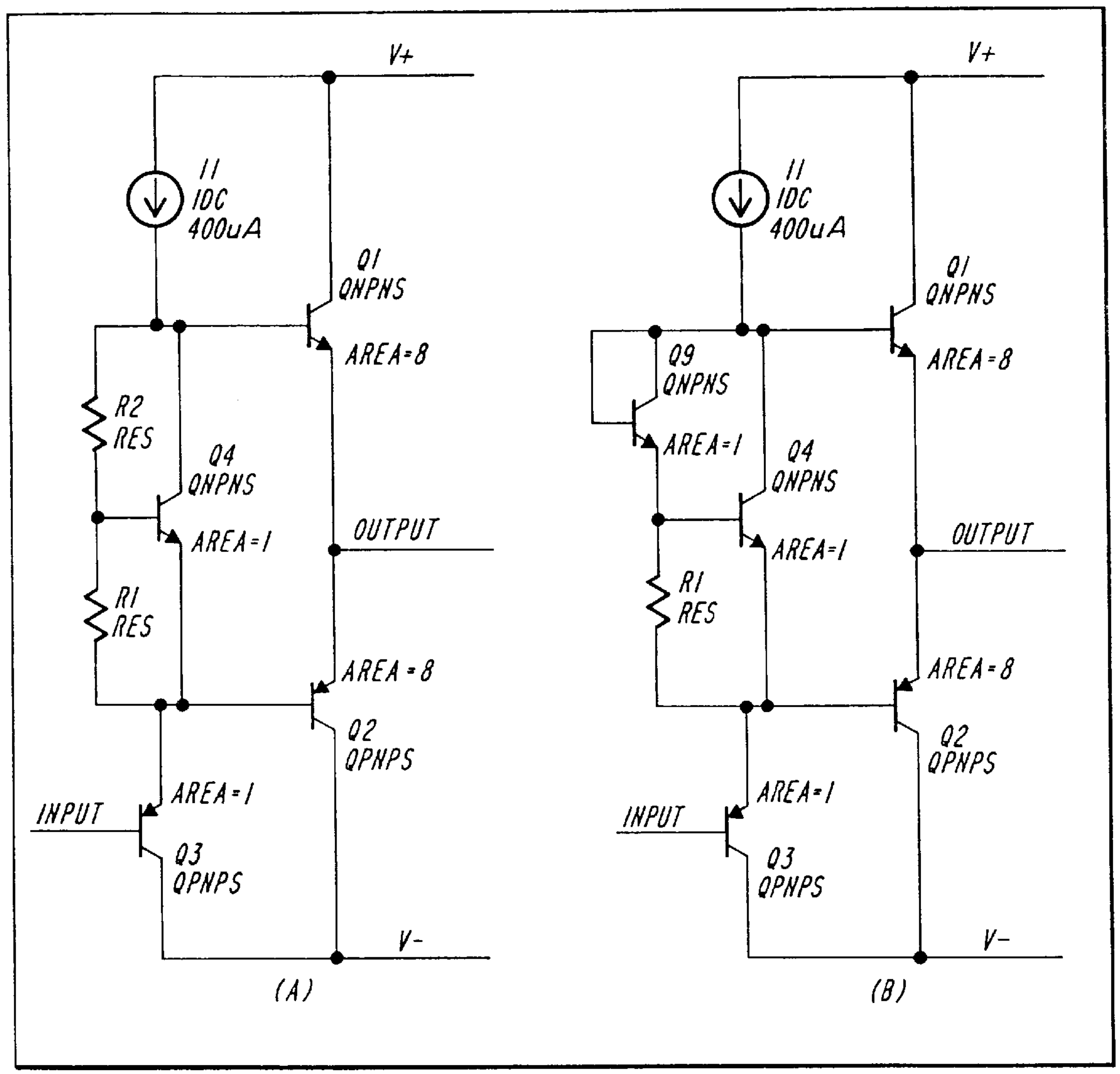
FIG. 4A illustrates a schematic view of a prior art implementation of a $V_{BE}$ multiplier output stage architecture.
FIG. 4B illustrates a schematic view of another prior art implementation of a $V_{BE}$ multiplier output stage architecture.

The present invention is directed to an improved output stage for providing isolation between a signal source and an external load. One preferred embodiment of an output stage 100, shown in schematic form in FIG. 8, includes an input section 102, an output section 104, and a control voltage source 106. The input section 102 receives an input signal from a signal source (not shown) and controls the operation of the output section 104 as a function of this input signal. The output section 104 provides high current drive capability to an external load (not shown), and as will be evident hereinafter, the control voltage source 106 is a component common to the input section 102 and output section 104. In accordance with one aspect of the present invention, the control voltage source 106 fixes the base-emitter voltage sums in both the input section 102 and output section 104, and provides a common path for the current defined by the difference between the bias current and the collector current of the driver transistors Q3 and Q4 in the input section 102.

The input section 102 includes a PNP bipolar transistor Q3 and an NPN bipolar transistor Q4, a first current source I1 and a second current source I2. The bases of transistors Q3 and Q4 are electrically coupled together, and are coupled to an input port 108 for receiving an input signal. The emitter of transistor Q3 is electrically coupled to the output of the first current source I1, the collector of transistor Q3 is electrically coupled to a negative voltage rail, i.e., a first voltage supply source V−, and the input of the first current source is electrically coupled to a positive voltage rail, i.e., a second voltage supply source V+. The collector of transistor Q4 is electrically coupled to the second voltage supply source V+, the emitter of transistor Q4 is electrically coupled to the input of the second current source I2, and the output of the second current source I2 is electrically coupled to the first voltage supply source V−.

The output section 104 of the stage 100 includes an NPN bipolar transistor Q1 and a PNP bipolar transistor Q2. The emitters of transistors Q1 and Q2 are electrically coupled together and are electrically coupled to an output port 110 for providing an output signal to an external load. The collector of transistor Q1 is electrically coupled to the second voltage supply source V+ and the collector of transistor Q2 is electrically coupled to the first voltage supply source V−. The base of transistor Q1 is electrically coupled to the output of the first current source I1 and the emitter of transistor Q3. The base of transistor Q2 is electrically coupled to the input of the second current source I2 and the emitter of transistor Q4.

The control voltage source 106 includes a positive terminal and a negative terminal. The positive terminal of source 106 is electrically coupled to the base of transistor Q1, the emitter of transistor Q3 and the output of the first current source I1. The negative terminal of source 106 is electrically coupled to the base of transistor Q2, the emitter of transistor Q4 and the input of the second current source I2.

In accordance with one aspect of the invention, the voltage V1 across the control voltage source 106 is set such that the desired quiescent current flows through output transistors Q1 and Q2. Adjusting voltage V1 causes the bias currents I1 and I2 to be split at different ratios between the paths including transistor Q3 and source 106, and the paths including transistor Q4 and source 106, respectively. To a large and significant extent, all of the currents in the output stage 100 are independent of current sources I1 and I2, and can be controlled by the voltage V1 across the control voltage source 106. Also, the current split between the paths including transistor Q3 and source 106, and the paths including transistor Q4 and source 106, can be controlled by changing the emitter area of each of the transistors Q3 and Q4. Changing the size of each of the transistors Q3 and Q4 and/or varying the current sources I1 and/or I2 does not affect the quiescent current through transistors Q1 and Q2. This is a fundamental difference between the present invention and the prior art output stage shown in FIG. 5. Thus, in the FIG. 8 embodiment the emitter area of each of the driver transistors Q3 and Q4 is arbitrary and independent of the emitter area of each of the output transistors Q1 and Q2, as long as the emitter area of each of the driver transistors Q3 and Q4 is smaller than the emitter area of each of the output transistors Q1 and Q2, providing a significant degree of design freedom. If the emitter areas of the driver transistors Q3 and Q4 are smaller than the emitter areas of the output transistors Q1 and Q2, the collector currents of Q3 and Q4 are less than the corresponding currents in the circuit shown in FIG. 5. The extra current flows through the control voltage source 106. Since emitter area translates directly to silicon area, the invention uses relatively less silicon area than that used to implement the prior art circuit shown in FIG. 5.

The following notation is used herein to describe the detailed operation of the output stage 100:

$I_{c1}$, $I_{c2}$, $I_{c3}$, $I_{c4}$=collector current of transistor Q1, Q2, Q3 and Q4, respectively;

$I_{V1}$=current through voltage source V1;

$I_{SN}$=NPN transistor saturation current;

$I_{SP}$=PNP transistor saturation current;

$V_T$=thermal voltage, 25.9 mV;

β=transistor current gain;

x=emitter area of each of the driver transistors Q3 and Q4; and z=emitter area of each of the output transistors Q1 and Q2.

In general, the collector currents of all transistors Q1, Q2, Q3 and Q4 can be expressed as:

$$I_{c1} = z \cdot I_{SN} \cdot \exp\left(\frac{V_{BE1}}{V_T}\right) \tag{2}$$

$$I_{c2} = z \cdot I_{SP} \cdot \exp\left(\frac{V_{EB2}}{V_T}\right) \tag{3}$$

$$I_{c3} = x \cdot I_{SP} \cdot \exp\left(\frac{V_{EB3}}{V_T}\right) \tag{4}$$

$$I_{c4} = x \cdot I_{SN} \cdot \exp\left(\frac{V_{EB4}}{V_T}\right), \tag{5}$$

where z is the emitter area of each of the transistors Q1 and Q2, x is the emitter area of each of the transistors Q3 and Q4, and $V_T$ is the thermal voltage defined as:

$$V_T = \frac{k \cdot T}{q} 25.9\,\text{mV}@27^\circ\ \text{C}. \tag{6}$$

The sum of the base-emitter voltages of the output transistors Q1 and Q2 is equal to the voltage source V1:

$$V1 = V_{BE1} + V_{EB2}. \tag{7}$$

Equation (7) can be rewritten by substituting the base-emitter voltages of transistors Q1 and Q2 from equations (2) and (3), as follows:

$$V1 = 2 \cdot V_T \cdot \ln\frac{\sqrt{I_{c1} \cdot I_{c2}}}{z \cdot \sqrt{I_{SN} \cdot I_{SP}}}. \tag{8}$$

The collector current of any transistor is equal to the product of its base current and its current gain β. The current gain factor varies from transistor to transistor and typically ranges from 40 to 300. The base currents of transistors Q1, Q2, Q3, and Q4 are consequently small relative to the corresponding collector currents, so to a first approximation, the base currents can be neglected. In this case, the collector currents of output transistors Q1 and Q2 can be considered equal. Thus, the quiescent current $I_q$ may be defined as:

$$I_q = I_{c1} = I_{c2}. \tag{9}$$

The quiescent current is the DC idle current flowing through the output transistors (i.e., from collector to emitter of transistor Q1 and from emitter to collector of transistor Q2) when no signal is applied at the input of the output stage 100. Substituting definition (9) into equation (8), the quiescent current can be calculated as:

$$I_q = z \cdot \sqrt{I_{SN} \cdot I_{SP}} \cdot \exp\left(\frac{V1}{2 \cdot V_T}\right). \tag{10}$$

Equation (10) implies that the quiescent current is a function of the voltage source V1 and the output transistor size. Equation (10) also implies that the quiescent current is independent of the size of the driver transistors Q3 and Q4, and of the bias current sources I1 and I2. This independence provides a significant degree of design freedom; the driver transistor size and bias current sources can be selected independent of the output transistors quiescent current and size.

The collector current of the driver transistors Q3 and Q4 can be calculated as a function of the bias control voltage source 106. The sum of the base-emitter voltages of transistors Q3 and Q4 is equal to V1 as shown in equation (11).

$$V1 = V_{EB3} + V_{BE4} \tag{11}$$

Equation (11) can be rewritten by substituting the base-emitter voltages of transistors Q3 and Q4 from equations (4) and (5), as follows:

$$V1 = 2 \cdot V_T \cdot \ln\frac{\sqrt{I_{c3} \cdot I_{c4}}}{x \cdot \sqrt{I_{SN} \cdot I_{SP}}} \tag{12}$$

For most applications, the bias current sources I1 and I2 are equal. The case when the bias current sources are not equal is considered to be a second order effect and it is discussed in more detail hereinafter. The bias current $I_B$ may be defined as:

$$I_B = I_1 = I_2 \tag{13}$$

If the base currents of all transistors are neglected, then the current through the voltage source 106 can be calculated as follows (refer to FIG. 8):

$$I_{V1} = I1 - I_{c3} = I_B - I_{c3} \tag{14}$$

$$I_{V1}=I2-I_{c4}=I_B-I_{c4} \quad (15)$$

Comparing equations (14) and (15) shows that the collector current of transistor Q3 is equal to the collector current of transistor Q4. So, the currents $I_{c3}$ and $I_{c4}$ can be calculated from equation (12) as follows:

$$I_{c3}=I_{c4}=x\cdot\sqrt{I_{SN}\cdot I_{SP}}\cdot\exp\left(\frac{VI}{2\cdot V_T}\right). \quad (16)$$

Dividing equation (10) by equation (16) provides the following relationship between the quiescent and collector currents:

$$\frac{I_q}{I_{c3}}=\frac{I_q}{I_{c4}}=\frac{z}{x}. \quad (17)$$

Comparing equations (7) and (11) demonstrates that the sum of output transistor base-emitter voltages is equal to the sum of the driver transistor base-emitter voltages. Therefore, the ratio of the collector currents of the output transistors, Q1 and Q2, to the collector currents of the driver transistors, Q3 and Q4, must be equal to the ratio of their respective emitter areas, which is expressed explicitly in equation (17).

Figure 5:
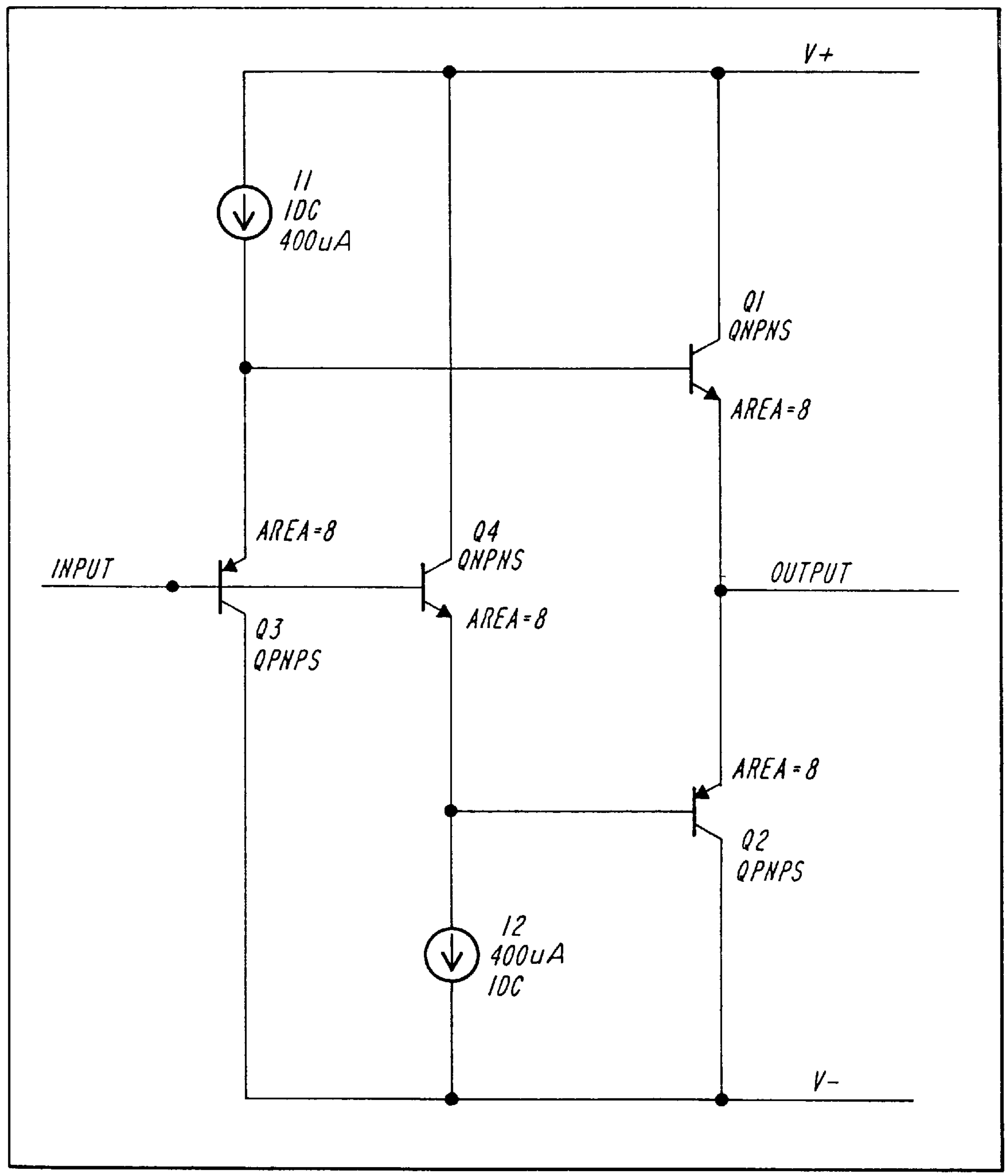
FIG. 5 illustrates a schematic view of yet another common embodiment of a prior art output stage architecture.
Figure 6:
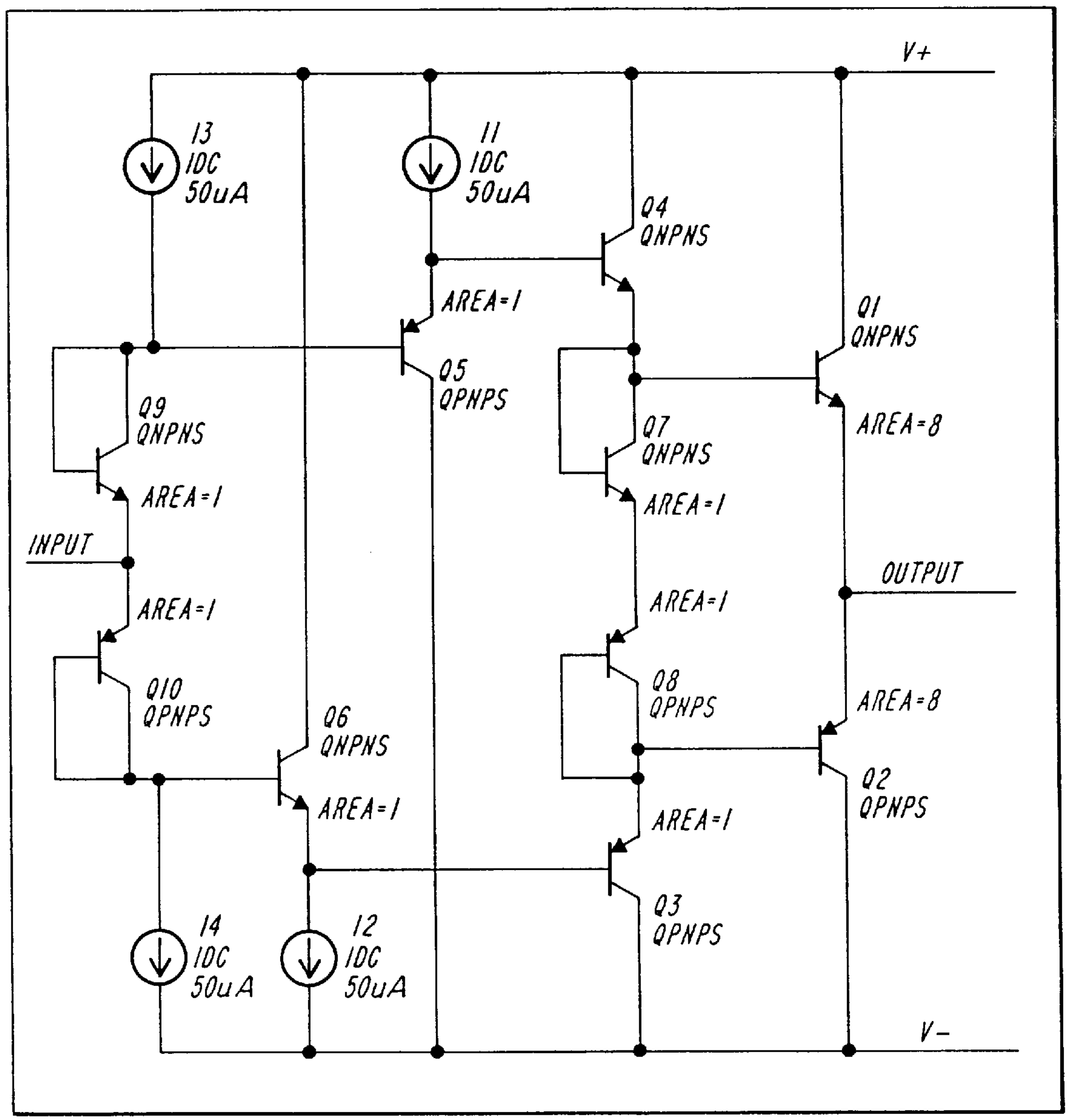
FIG. 6 shows a variation of the prior art output stage architecture shown in FIG. 5.
Figure 7:
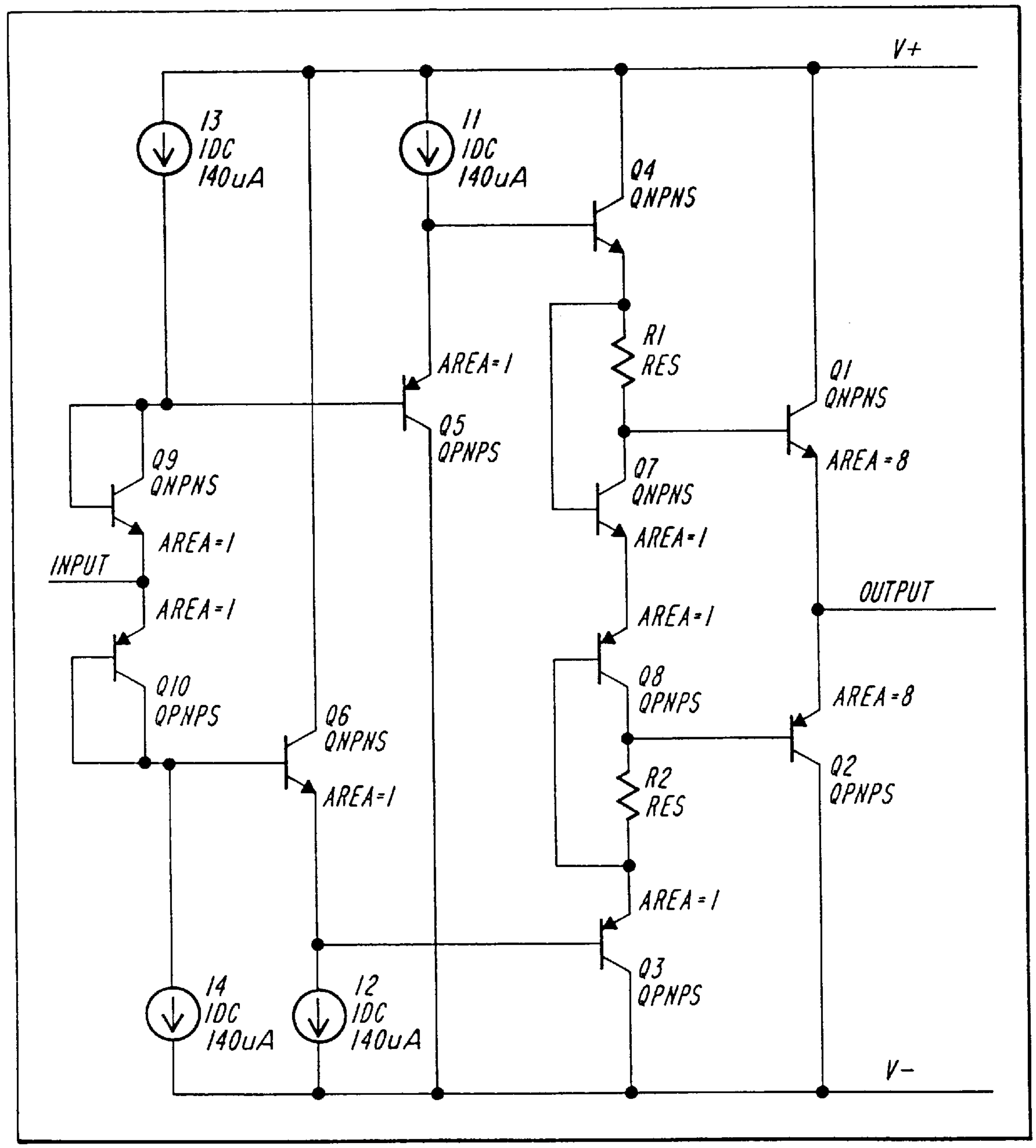
FIG. 7 shows yet another variation of the prior art output stage architecture shown in FIG. 5.

The same relationship between the quiescent current and the driver collector current exists in the circuit shown in FIG. 5. In the case of FIG. 5, the collector current of the driver transistors is equal to the current of the bias sources, I1 and I2. If the bias current sources I1 and I2 are equal, then $I_{c3}=I_{c4}=I_B$. However, a change in the size of the driver transistor emitter area, 'x', in the FIG. 5 circuit, would result in a change of the quiescent current $I_q$. This happens because the bias current sources are connected only to the driver transistors. In the case of the FIG. 8 embodiment of the present invention, the same change to the size of the driver transistor emitter area would not modify the quiescent current $I_q$. Instead, the collector currents of the driver transistors, $I_{c3}$ and $I_{c4}$, change accordingly to equation (17). The "difference current" between the bias current and the collector current of the driver transistors flows through the voltage source 106. The current through the control voltage source 106 can be calculated by substituting equation (16) into equation (14), as follows:

$$I_{VI}=I_B-x\cdot\sqrt{I_{SN}\cdot I_{SP}}\cdot\exp\left(\frac{VI}{2\cdot V_T}\right). \quad (18)$$

As described above, the proper operation of the present invention depends upon the fact that the current $I_{V1}$, that flows through the control voltage source 106, can vary. Thus, the control voltage source must be capable of maintaining a constant voltage V1 as the current $I_{V1}$ varies. FIG. 9 illustrates a schematic view of a preferred embodiment of the control voltage source 106 for use in the FIG. 8 embodiment. Transistors Q19, Q20 and resistor R form a voltage source producing a voltage V1 between nodes A and B (referenced in both FIGS. 8 and 9) which can be controlled as a function of the value of resistor R. The voltage across nodes A and B is relatively constant for a wide range of currents flowing through the voltage source 106. In order to describe this embodiment of control voltage source 106, the following notations are used in addition to the notations used to describe the detailed operation of the output stage 100:

$V_R$=voltage across resistor R;

$I_R$=resistor current; and e=natural logarithm base, e=2.718.

The voltage between nodes A and B, V(A-B), can be calculated as follows:

$$V_{(A-B)}=V_{(EB)_{Qt}}-V_R+V_{(BE)_{Q2}} \quad (19)$$

$$V_{(A-B)}=V_T\cdot\ln\left(\frac{I_{cl}}{I_{SP}}\right)-I_R\cdot R+V_T\cdot\ln\left(\frac{I_{c2}}{I_{SN}}\right) \quad (20)$$

Equations (19) and (20) show that the base-emitter voltages add and the resistor voltage subtracts from the total value of V(A-B), so if the collector current increases, the base-emitter voltages go up as well. Almost all of the collector current flows through resistor R. When the collector current increases, the voltage across resistor R increases as well. Since the resistor voltage is subtracted from the base-emitter voltages, they tend to cancel each other, which maintains the voltage across nodes A and B at a relatively constant value.

In a more exact form, the collector and resistor currents can be defined as follows:

$$I_{cl}=I-I_{bl}=I\cdot\left(1-\frac{1}{\beta_1}\right) \quad (21)$$

$$I_R=I_{cl}-I_{b2}=I-I_{bl}-I_{b2}=I\cdot\left(1-\frac{1}{\beta_1}-\frac{1}{\beta_2}\right) \quad (22)$$

$$I_{c2}=I_R+I_{bl}=I-I_{b2}=I\cdot\left(1-\frac{1}{\beta_2}\right), \quad (23)$$

where I is the current flowing into node A and exiting through node B.

Substituting equations (21), (22) and (23) into equation (20), the voltage between nodes A and B becomes:

$$V_{(A-B)}=2\cdot V_T\cdot\ln\left(\frac{1}{\sqrt{I_{SP}\cdot I_{SN}}}\right)+ V_T\cdot\ln\left(1-\frac{1}{\beta_1}-\frac{1}{\beta_2}-\frac{1}{\beta_1\cdot\beta_2}\right)-I\cdot R\cdot\left(1-\frac{1}{\beta_1}-\frac{1}{\beta_2}\right) \quad (24)$$

As mentioned before, the base-emitter voltages and the resistor voltage tend to cancel; a particular current exists for which the cancellation is perfect. This particular current can be calculated by equating the derivative of the voltage between nodes A and B, with respect to current, to zero.

$$\frac{\partial V_{(A-B)}}{\partial I}=0 \quad (25)$$

Substituting the expression (24) for $V_{(A-B)}$ into equation (25), the following equation results:

$$\frac{2\cdot V_T}{I}-R\cdot\left(1-\frac{1}{\beta_1}-\frac{1}{\beta_2}\right)=0 \quad (26)$$

and solving (26) for the current I provides:

$$I_0=\frac{2\cdot V_T}{R}\cdot\frac{1}{\left(1-\frac{1}{\beta_1}-\frac{1}{\beta_2}\right)} \quad (27)$$

where $I_0$ is the nominal current through the control voltage source for which the voltage cancellation is ideal.

Substituting $I_0$ from equation (27) in equation (24), the voltage across nodes A and B, for which the cancellation is perfect, can be calculated as follows:

$$v_{(A-B)0} = 2\cdot V_T\cdot\left[\ln\left(\frac{2\cdot V_T}{R}\cdot\frac{1}{\sqrt{I_{SP}\cdot I_{SN}}}\right)-1+\ln\left(\frac{\sqrt{1-\frac{1}{\beta_1}-\frac{1}{\beta_2}-\frac{1}{\beta_1\cdot\beta_2}}}{1-\frac{1}{\beta_1}-\frac{1}{\beta_2}}\right)\right] \quad (28)$$

Equation (28) can be simplified by noticing that the contribution of the last logarithmic term in parenthesis is very small. Assume that β is much greater than one (β>>1), and for the sake of example, $\beta_{min}$=10. For currents in the hundreds of $\mu$A, according to equation (27), resistor R is on the order of kΩ ($10^3$) or less. The order of magnitude of the transistor saturation currents, $I_{SP(N)}$, is about $10^{-16}$. Using these numbers in equation (28), the first and last logarithmic terms in the parenthesis can be calculated. The first term is about 27 and the last one is about 0.1. There is a difference of two orders of magnitude between the first and last logarithmic term. Therefore, the last logarithmic term can be ignored. Also, taking into account the properties of the logarithmic function, 1n(e)=1, equation (28) can be written as follows:

$$V_{(A-B)0} \simeq 2\cdot V_T\cdot\ln\left(\frac{2\cdot V_T}{R}\cdot\frac{1}{e}\cdot\frac{1}{\sqrt{I_{SP}\cdot I_{SN}}}\right) \quad (29)$$

The above equation demonstrates that the voltage between nodes A and B can be set by resistor R. Using the same approximation, i.e., neglecting the effect of the base currents, equation (24), that describes the dependence of the voltage across nodes A and B with respect to current I, can be simplified as follows:

$$V_{(A-B)} \simeq 2\cdot V_T\cdot\ln\left(\frac{I}{\sqrt{I_{SP}\cdot I_{SN}}}\right)-I\cdot R \quad (30)$$

Figure 10:
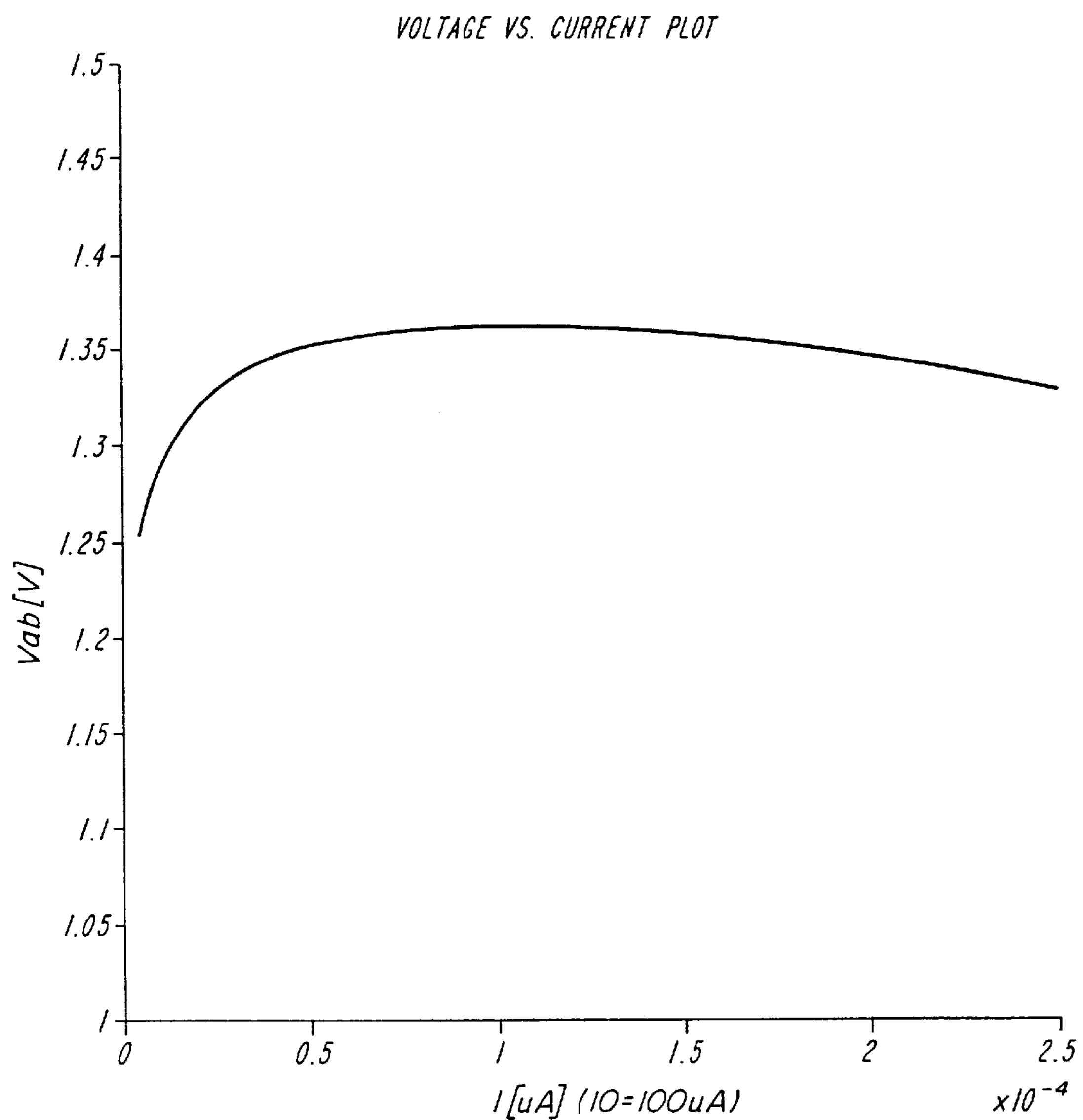
FIG. 10 shows a graphical representation of the voltage across the control voltage source of FIG. 9.

FIG. 10 shows a plot of the voltage $V_{(A-B)}$ defined in equation (30). The voltage across the voltage source 106 is kept relatively constant when the current passing through it sweeps a relatively wide range.

Figure 11:
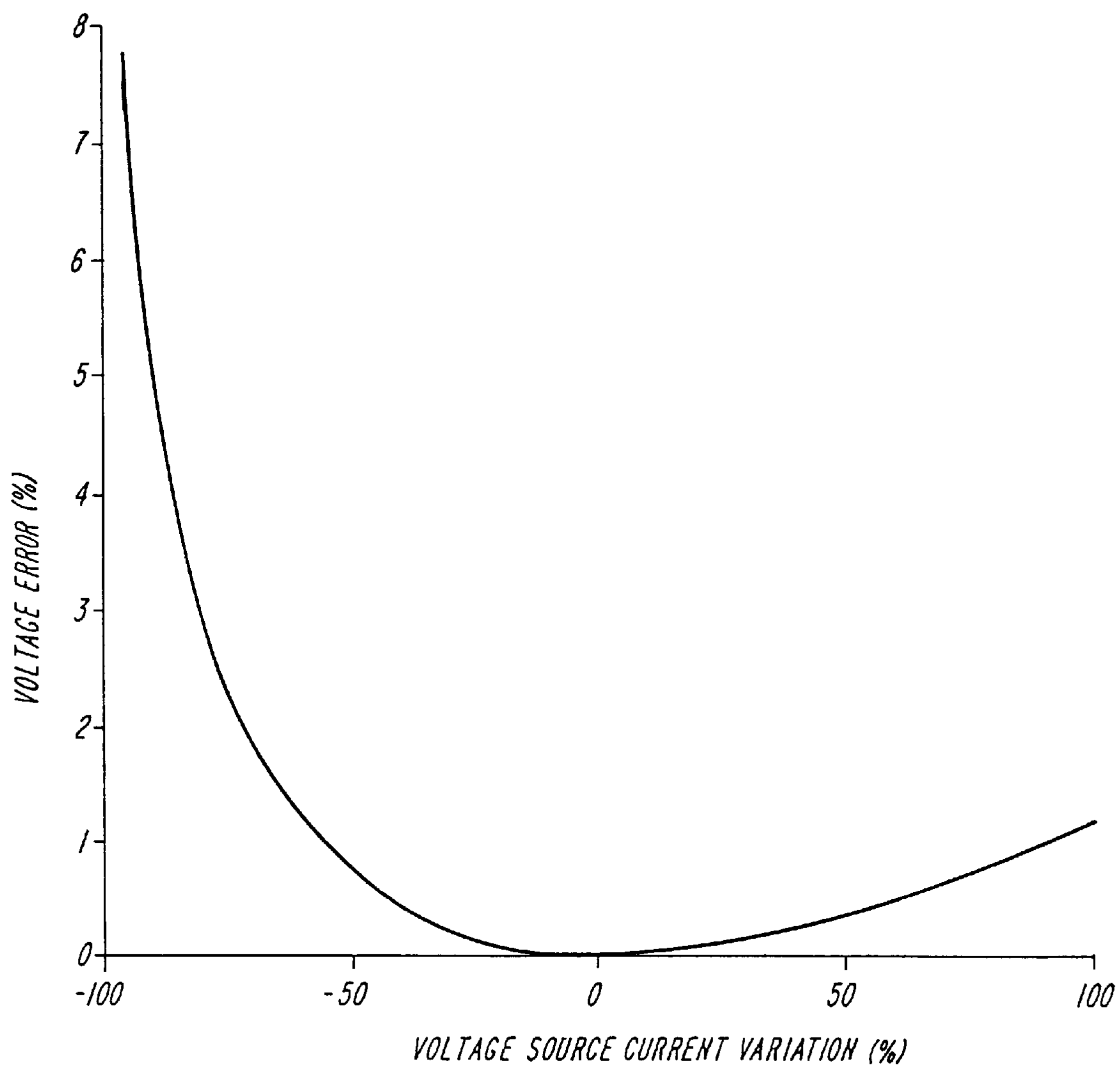
FIG. 11 shows a graphical representation of the voltage error across the control voltage source of FIG. 9 when the current is varied by 50%.
Figure 12:
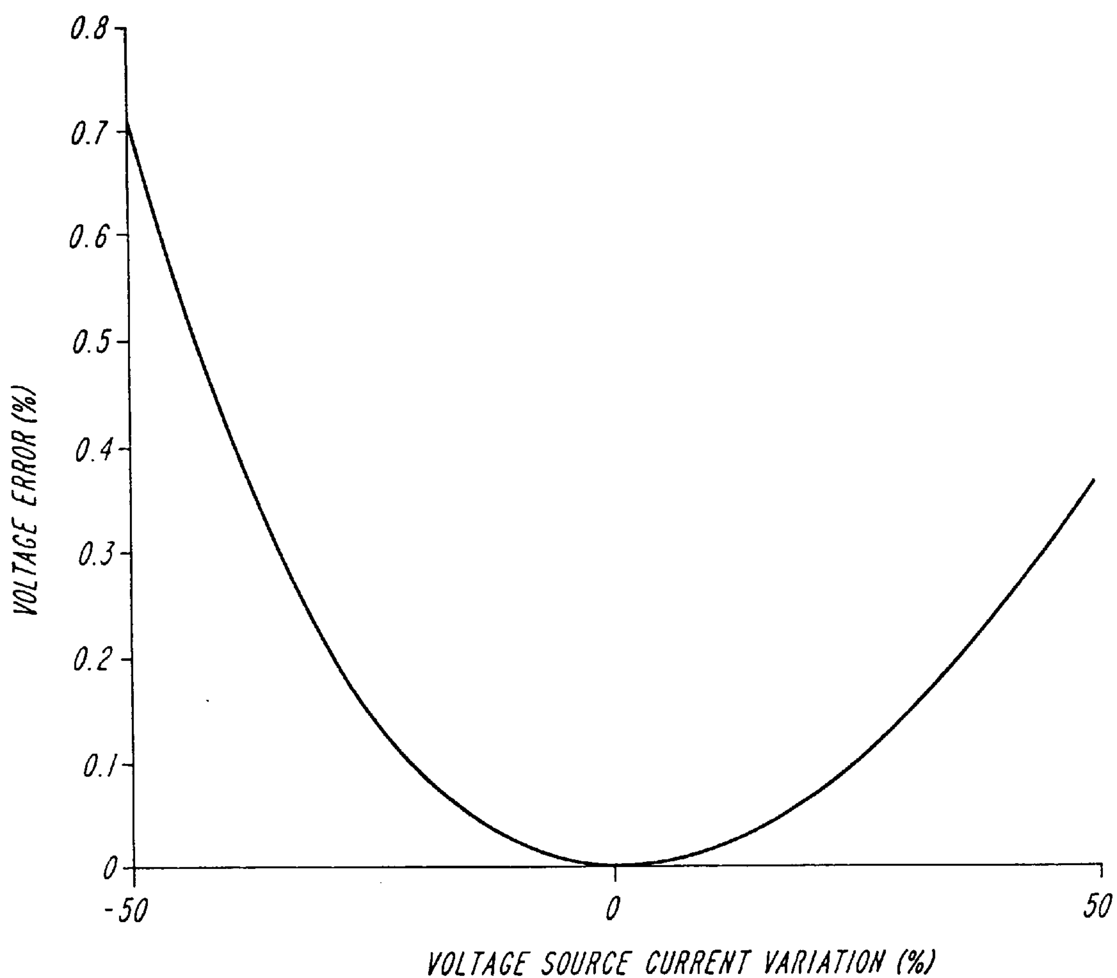
FIG. 12 shows the voltage error across the control voltage source of FIG. 9 when the current is varied by 100%.

FIG. 11 and FIG. 12 show the error of the voltage across the voltage source 106 when the current is varied by 50% and by 100%, respectively.

Figure 8:
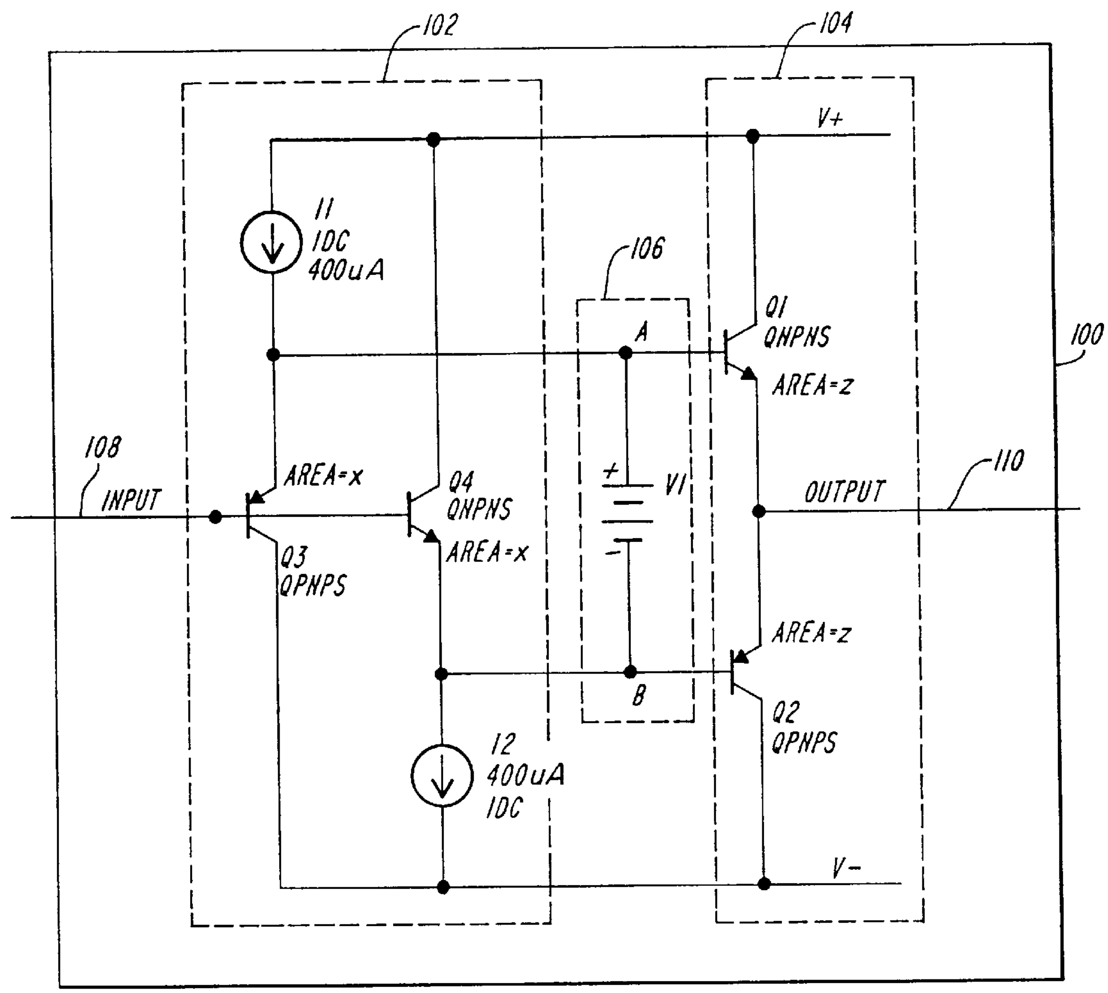
FIG. 8 illustrates a schematic view of an improved output stage architecture according to the present invention.
Figure 9:
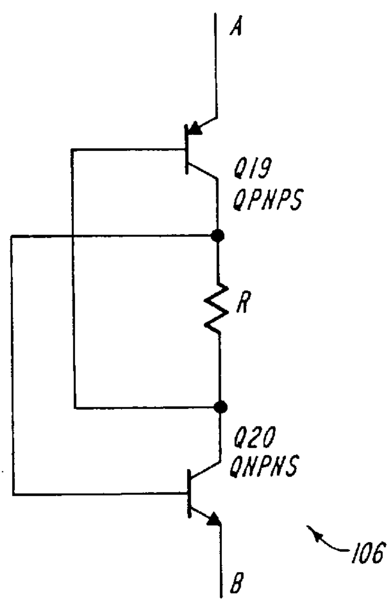
FIG. 9 illustrates a schematic view of a preferred embodiment of the control voltage source 106 from FIG. 8.
Figure 13:
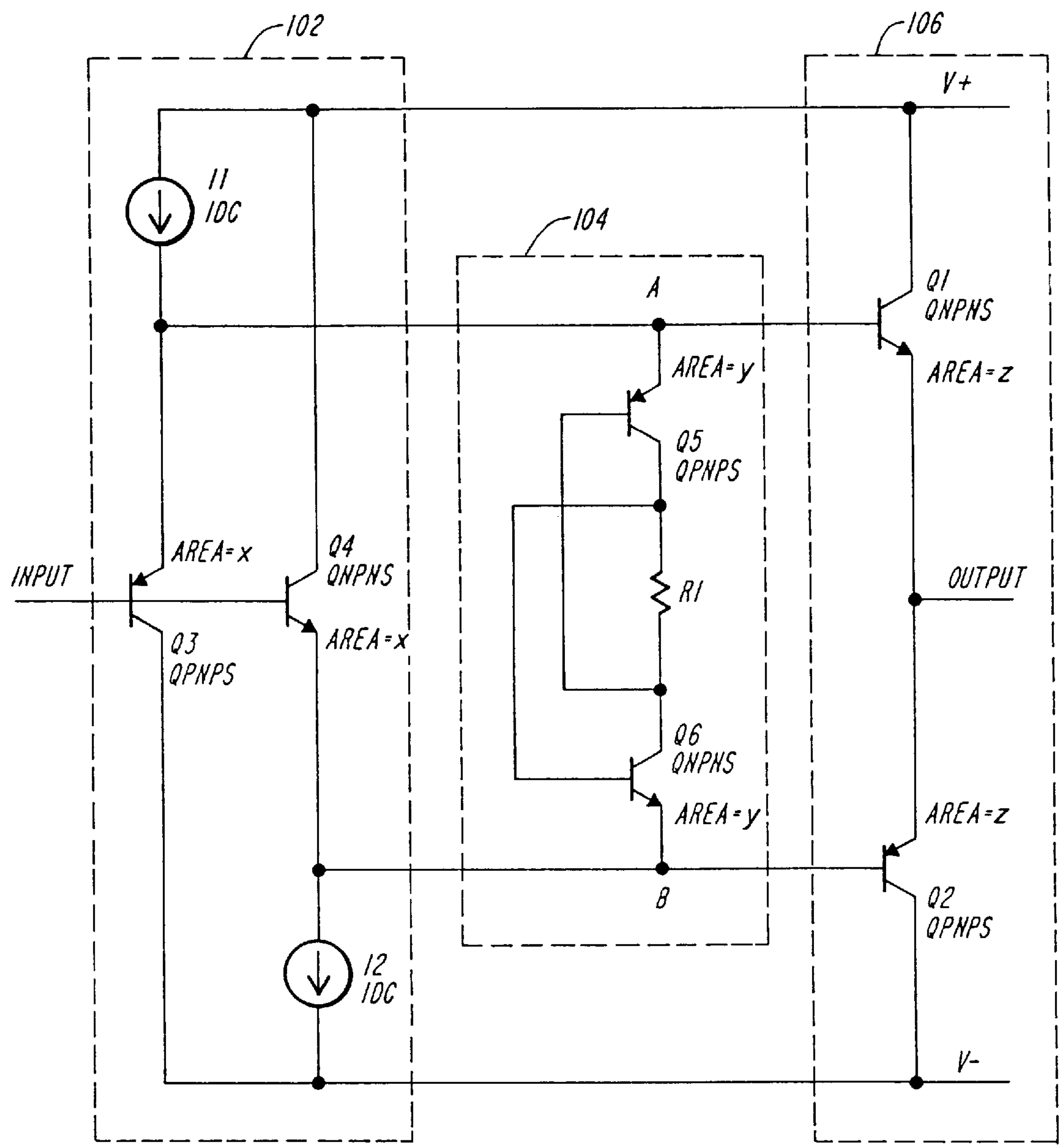
FIG. 13 illustrates a schematic view of the output stage of FIG. 8, modified to include the embodiment of the control voltage source of FIG. 9.

The circuit of FIG. 8, including the specific implementation of the voltage source of FIG. 9, is shown in FIG. 13. The control voltage source 106 is formed by transistors Q5, Q6 and resistor R1. The emitter area of the voltage source transistors is defined as 'y'. Using the aforementioned notations and reference designators, the voltage across nodes A and B, as defined by equation (30), can be written as follows:

$$V_{(A-B)} \simeq 2\cdot V_T\cdot\ln\left(\frac{I_{VI}}{y\cdot\sqrt{I_{SP}\cdot I_{SN}}}\right)-I_{VI}\cdot R_1 \quad (31)$$

Neglecting the base currents of transistors Q5 and Q6, the voltage across nodes A and B is substantially independent of the current flowing through the voltage source, $I_{V1}$, when the current has the following value:

$$I_{VI}^0 = \frac{2\cdot V_T}{R_1} \quad (32)$$

where $I_{V1}^0$ is the nominal current for which the voltage across nodes A and B is independent of current $I_{V1}$.

The voltage across nodes A and B, for which the sensitivity with respect to current $I_{V1}$ is minimum, is calculated by substituting equation (32) into equation (31):

$$V_{(A-B)0} \simeq 2\cdot V_T\cdot\ln\frac{2\cdot V_T}{R_1}\cdot\frac{1}{e}\cdot\frac{1}{y\cdot\sqrt{I_{SP}\cdot I_{SN}}} \quad (33)$$

The quiescent current of the output transistors, Q1 and Q2, is evaluated by substituting the voltage equation (31) into equation (10), as follows:

$$I_q = I_{VI}\cdot\frac{z}{y}\cdot\exp\left(-\frac{I_{VI}\cdot R_1}{2\cdot V_T}\right) \quad (34)$$

The quiescent current is a function of the current flowing through the voltage source connected at nodes A and B. Current $I_{V1}$, in the exponential function of equation (34), tends to decrease the value of the quiescent current. The term $I_{V1}$ multiplies the exponential function and tends to increase the value of the quiescent current. Thus, these two terms in equation (34) tend to cancel each other and maintain the quiescent current at a substantially constant value. The current $I_q$, as a function of $I_{V1}$, has a maximum that can be calculated by substituting equation (32) into equation (34), as follows:

$$I_q^O = \frac{2\cdot V_T}{R_1}\cdot\frac{1}{e}\cdot\frac{z}{y} \quad (35)$$

Figure 14:
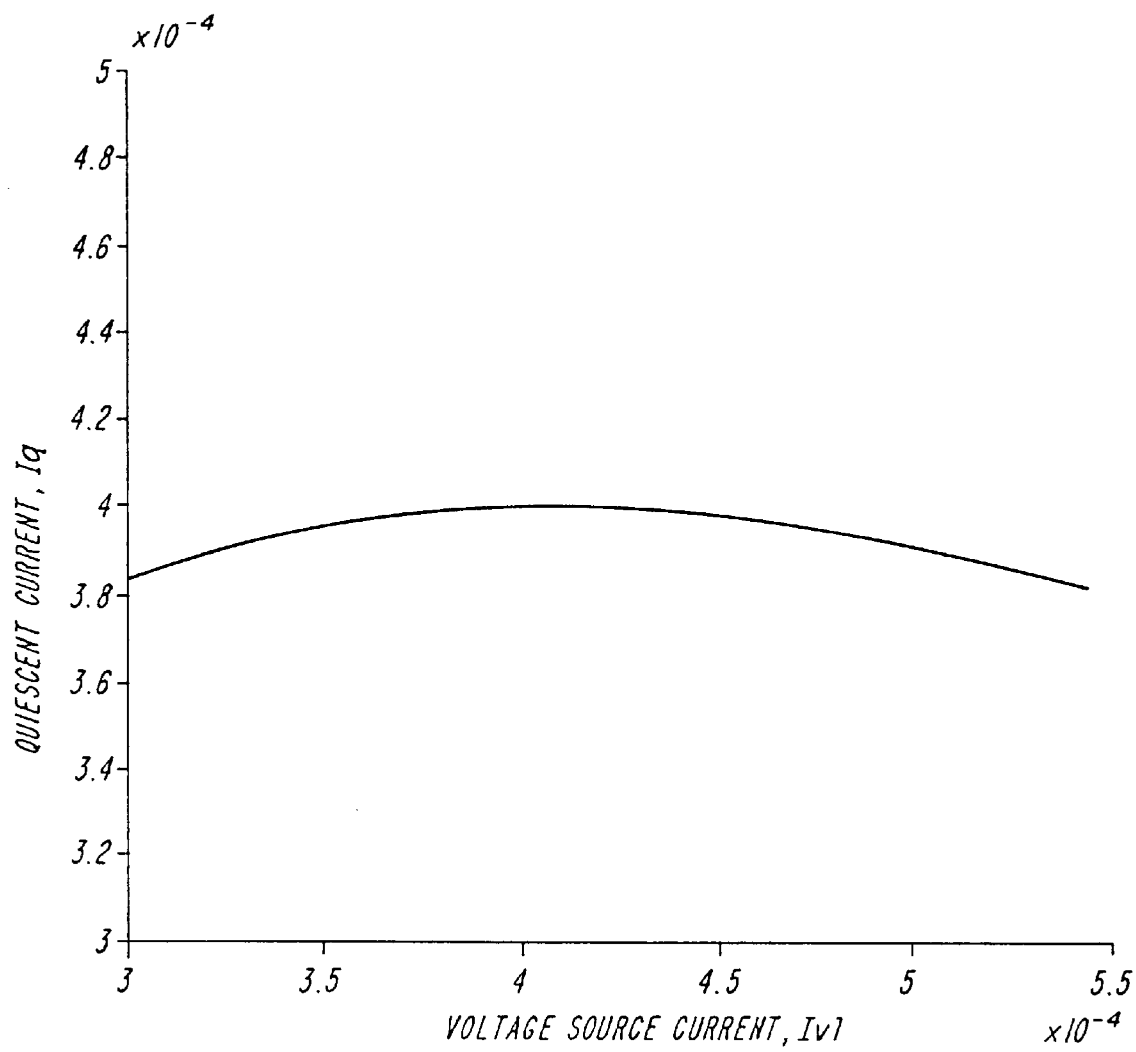
FIG. 14 shows a graphical representation of the quiescent current through the output transistors of FIG. 13 as a function of the voltage source current.

FIG. 14 shows a plot of the quiescent current as defined by equation (34). The resulting curve has a peak (i.e., a maximum value) that can be calculated using equation (35). Notice that while the current through the voltage source sweeps a wide range, the quiescent current is substantially constant, within 5%. For a meaningful comparison of the embodiment shown in FIG. 13 with the prior art circuit shown in FIG. 5, the quiescent current $I_q$ can be plotted with respect to the bias current sources. The bias current source is the sum of the driver transistor collector current and the current through the voltage source.

$$I_1=I_{c3}+I_{V1};I_2=I_{c4}+I_{V1} \quad (36)$$

In typical prior art designs, the bias current sources I1 and I2 are equal or very close in value. Therefore, it is reasonable to assume that they are exactly equal. Under this assumption, the collector currents of the driver transistors are also equal.

$$I_B=I_1=I_2=>I_{c3}=I_{c4} \quad (37)$$

The relationship between the quiescent current and the collector currents of the driver transistors is shown in equation (17). Substituting $I_q$ from equation (34) in equation (17), the collector current of driver transistor Q3 is calculated as follows:

$$I_{c3} = I_q \cdot \frac{x}{y} \cdot \exp\left(-\frac{I_{V1} \cdot R_1}{2 \cdot V_T}\right) \tag{38}$$

Substituting equation (38) in equation (36) results in the following equation:

$$I_B = I_{V1} \cdot \frac{x}{y} \cdot \exp\left(-\frac{I_{V1} \cdot R_1}{2 \cdot V_T}\right) + I_{V1} \tag{39}$$

Figure 15:
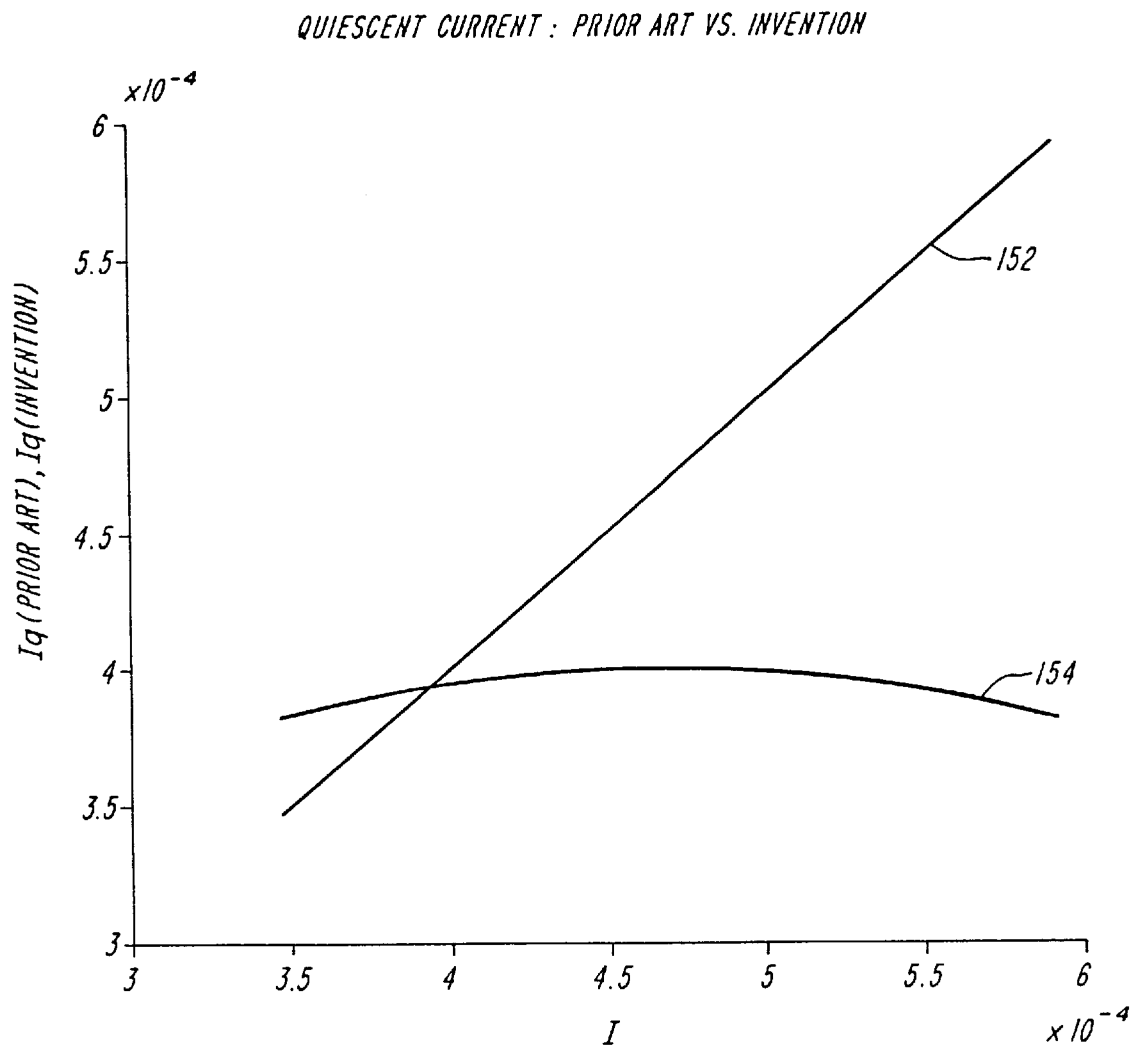
FIG. 15 shows a graphical representation of the quiescent current with respect to the bias current of the output transistors of FIG. 13.

Equation (39) does not have an analytical solution for $I_{V1}$. In order to plot the quiescent current $I_q$, versus bias current $I_B$, equation (39) is solved numerically first and then $I_{V1}$ is substituted in equation (34) to finally calculate $I_q$. In order to compare this preferred embodiment of FIG. 13 with the prior art of FIG. 5, the quiescent current of the output transistors Q1 and Q2 in FIG. 5 is also plotted in FIG. 15, which compares $I_q$ of the FIG. 5 circuit, indicated at 152 to the $I_q$ of the FIG. 13 circuit, indicated at 154. In the case of the preferred embodiment (shown in FIG. 13), the quiescent current remains substantially constant, while in the prior art circuit (shown in FIG. 5), the quiescent current increases linearly with the bias current.

Figure 16:
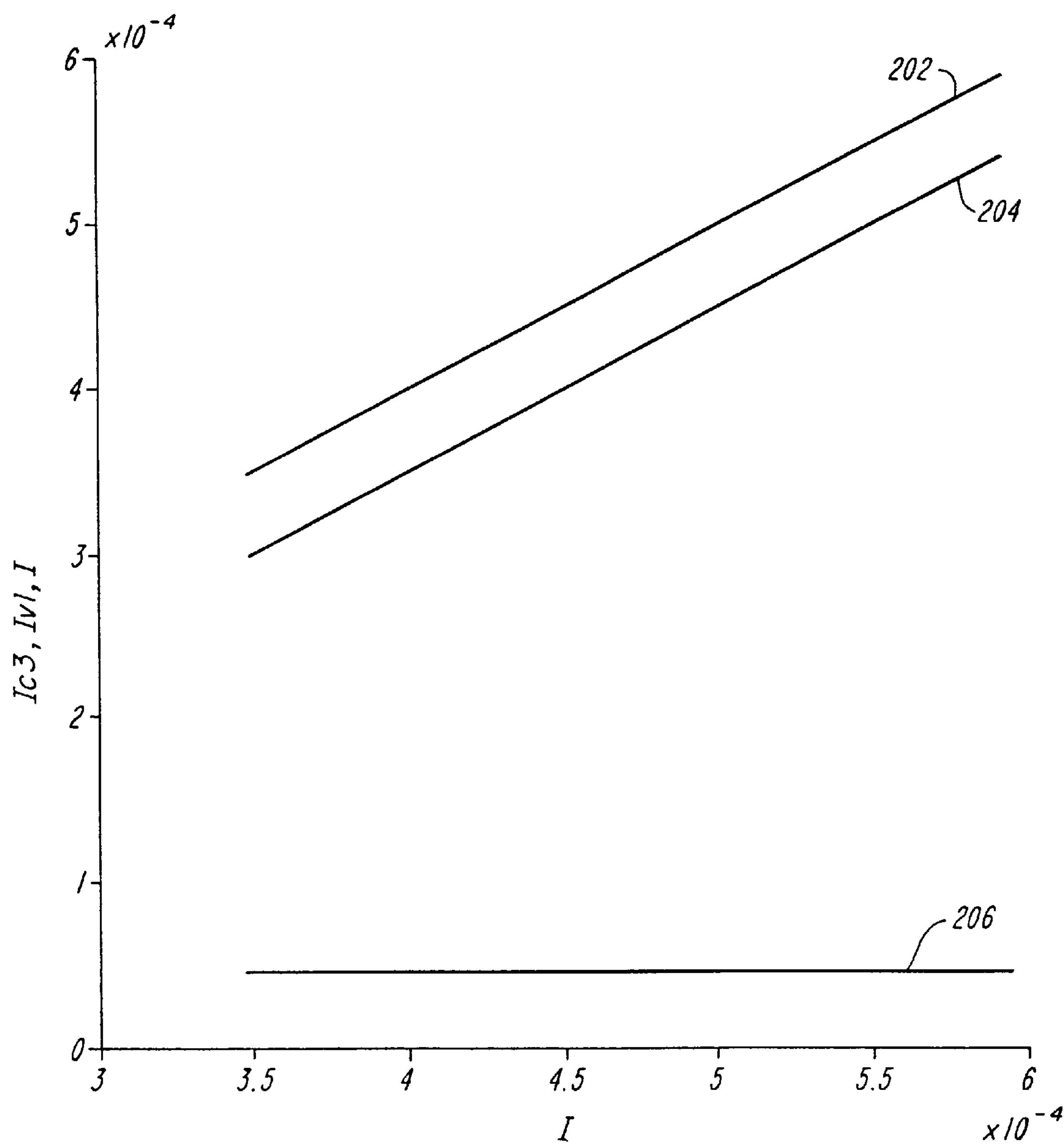
FIG. 16 plots the bias current source output, the control voltage source current and the current through the driver transistors against the bias current source output.

According to equation (17), the collector currents of the driver transistors are linearly proportional to the quiescent current. Consequently, the collector current of the driver transistors is fairly constant with respect to bias current, and if the bias current varies, the extra current that flows through the control voltage source 106 (connected between nodes A and B) is linearly proportional to the bias current. This dependence is shown in FIG. 16, which plots the bias current source output 202, the control voltages source 204 and the current through the driver transistors 206 against the bias current source output. Since no analytical solution exists for the quiescent current as a function of the bias current, the quiescent current sensitivity with respect to bias current can not be calculated. However, given the linear relationship between the bias current and the current through the voltage source, a good approximation can be made by calculating the quiescent current sensitivity with respect to the current through the voltage source.

$$S_{I_B}^{I_q} \simeq S_{I_{V1}}^{I_q} = \frac{I_{V1}}{I_q} \cdot \frac{\partial I_q}{\partial I_{V1}} \tag{40}$$

Substituting equation (34) into equation (40), the sensitivity is calculated as follows:

$$S_{I_{V1}}^{I_q} = \frac{I_{V1}}{I_q} \cdot \frac{\partial I_q}{\partial I_{V1}} = 1 - I_{V1} \cdot \frac{R_1}{2 \cdot V_T} \tag{41}$$

The quiescent current becomes independent of the current through the voltage source when the sensitivity of $I_q$ with respect to $I_{V1}$ equals zero. This happens when the current through the voltage source has the following value:

$$I_{V1}^o = \frac{2 \cdot V_T}{R_1} \tag{42}$$

Equation (42) is equivalent to equation (27). The same result was reached by solving the problem via two different approaches: i) minimize the dependence of the voltage across nodes A and B with respect to the current flowing through the voltage source, and ii) minimize the quiescent current dependence with respect to bias current source.

Substituting equation (42) into equation (34) the nominal operating point for the output transistors is calculated, as indicated in equation (35). Substituting equations (35) and (42) into equation (34), the quiescent current has the following formula:

$$I_q = I_{V1} \cdot \frac{I_q^o}{I_{V1}^o} \cdot \exp\left(1 - \frac{I_{V1}}{I_{V1}^o}\right) \tag{43}$$

Figure 17:
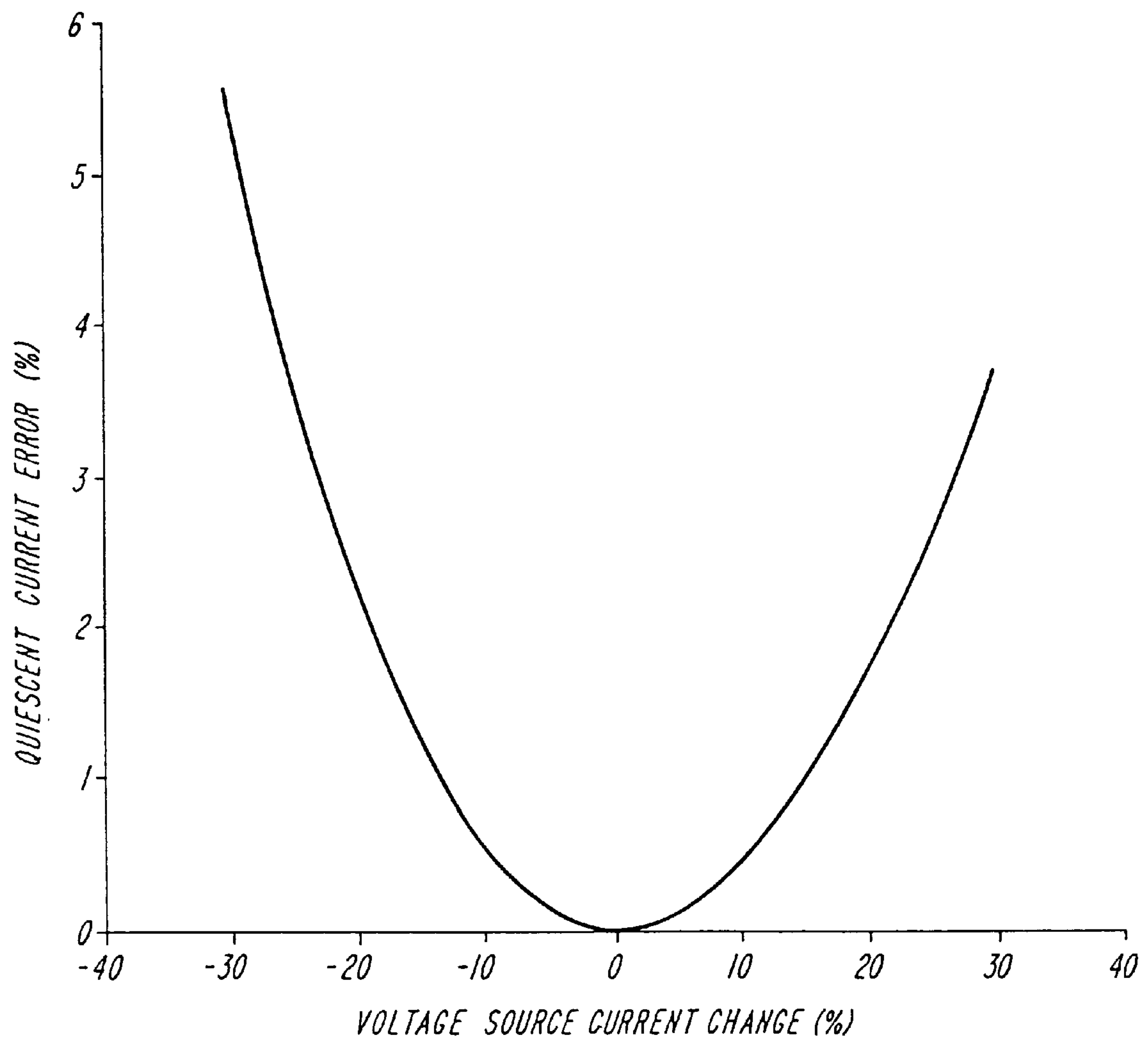
FIG. 17 graphically illustrates the percent-error of the output transistor quiescent current with respect to the percent change in the current through the control voltage source.

Equation (43) is plotted in FIG. 17 in relative units. The x and y axes are defined as follows:

$$'x\ axis' = \left(\frac{I_{v1} - I_{v1}^o}{I_{v1}^o}\right) \cdot 100 \tag{44}$$

$$'y\ axis' = \left|\left(\frac{I_q - I_q^o}{I_q^o}\right) \cdot 100\right| \tag{45}$$

Notice that, a change of ±30% in voltage source current changes the quiescent current only by 5%.

Substituting equation (42) into equation (39), the bias current is:

$$I_B = \frac{2 \cdot V_T}{R_1} \cdot \left(1 + \frac{x}{y}\frac{1}{e}\right) \tag{46}$$

The bias current is usually determined by the maximum output current divided by the minimum current gain factor of the output transistors. Thus, the resistor value of R1 can be calculated from equation (46) as follows:

$$R_1 = \frac{2 \cdot V_T}{I_B} \cdot \left(1 + \frac{x}{y}\frac{1}{e}\right) \tag{47}$$

The bias current must be greater than, or equal to, the maximum base current of the output transistors. Therefore, equation (46) can be written as:

$$\frac{2 \cdot V_T}{R_1} \cdot \left(1 + \frac{x}{y}\frac{1}{e}\right) \geq I_B \tag{48}$$

Solving equation (48) for transistor emitter area ratio results in:

$$\frac{x}{y} \geq e \cdot \left(\frac{I_B}{\frac{2 \cdot V_T}{R_1}} - 1\right) \tag{49}$$

Notice from equation (35) that resistor R1 can be expressed as a function of the nominal quiescent current as follows:

$$R_1 = \frac{2 \cdot V_T}{I_q^o} \cdot \frac{1}{e} \cdot \frac{z}{y} \tag{50}$$

Substituting equation (50) into equation (49) and solving for voltage source transistor emitter area, 'y', results in:

$$y \geq \frac{1}{e} \cdot \left(z \cdot \frac{I_B}{I_q^o} - x\right) \tag{51}$$

The transistor area is preferably an integer. Thus, the emitter area of voltage source transistors is preferably rounded as follows (one was added because the integer function rounds down):

$$y \geq 1 + Int\left[\frac{1}{e}\cdot\left(z\cdot\frac{I_B}{I_q^o} - x\right)\right] \tag{52}$$

Since the output transistor size is fixed, it is necessary to determine which is the most effective driver and voltage source transistor size. The total transistor area is:

$$A_{tot}=2\cdot(x+y+z) \tag{53}$$

Substituting equation (51) into equation (53), the total area can be calculated as a function of driver and output transistor size as follows:

$$A_{\min} \geq 2\cdot\left[x\cdot\left(1-\frac{1}{e}\right)+z\cdot\left(1+\frac{1}{e}\cdot\frac{I_B}{I_q^o}\right)\right] \tag{54}$$

According to equation (54), the minimum area is obtained when the driver transistor has the minimum size, 1 x.

The transistor area necessary for the circuit in FIG. 5 is:

$$A_{FIG\ 5}=2\cdot(x+z) \tag{55}$$

Substituting equation (17) into equation (55), and noticing that in FIG. 5 the driver collector current is equal to the bias current, equation (55) becomes:

$$A_{FIG5} = 2\cdot z\cdot\left(1+\frac{I_B}{I_q^o}\right) \tag{56}$$

The area savings realized with the new output stage topology is:

$$A_{SAV}=A_{FIG\ 5}-A_{min} \tag{57}$$

Substituting formulae (54) and (56) into equation (57), the area savings is as follows:

$$A_{sav} \geq 2\cdot\left(1-\frac{1}{e}\right)\cdot\left(z\cdot\frac{I_B}{I_q^o} - x\right) \tag{58}$$

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. An apparatus for buffering and isolating a signal source from an external load, said apparatus having a signal input terminal for receiving an input signal from said signal source and a signal output terminal for providing an output signal, corresponding to said input signal, to said external load, comprising, a first bias current source providing a first emitter current to a first driver transistor and a first bias current to a first output transistor;

a second bias current source receiving a second emitter current from a second driver transistor and a second bias current from a second output transistor, said input signal biasing said first driver transistor and said second driver transistor, and said output terminal being electrically coupled to an emitter of said first output transistor and to an emitter of said second output transistor; and, a control voltage source characterized by a control voltage across the control voltage source and a control current flowing through the control voltage source, wherein said control voltage remains constant for different values of control current, said control voltage source being electrically coupled between an emitter of said first driver transistor and an emitter of said second drive transistor, wherein said first bias current and said second bias current vary as a predetermined function of said control voltage.

2. An apparatus according to claim 1, wherein said first driver transistor includes a PNP type transistor, said second driver transistor includes an NPN type transistor, said first output transistor includes an NPN type transistor, and said second output transistor includes a PNP type transistor.

3. An apparatus according to claim 1, further including supply voltage sources electrically coupled between a collector of said first output transistor and a collector of said second output transistor.

4. An apparatus according to claim 1, wherein said predetermined function includes a substantially exponential relationship.

5. An apparatus according to claim 1, wherein a quiescent current through said first output transistor and a quiescent current through said second output transistor are substantially independent of said first current source and said second current source.

6. An apparatus according to claim 1, wherein said control voltage source includes a resistor, a PNP type transistor, and an NPN type transistor, said resistor being electrically coupled between a collector of said PNP type transistor and a collector of said NPN type transistor, a base of said PNP type transistor being electrically coupled to said collector of said NPN type transistor, a base of said NPN transistor being electrically coupled to said collector of said PNP type transistor, an emitter of said PNP type transistor being electrically coupled to said emitter of said first driver transistor, and an emitter of said NPN type transistor being electrically coupled to said emitter of said second drive transistor.

7. An apparatus for buffering and isolating a signal source from an external load, said apparatus having a signal input terminal for receiving an input signal from said signal source and a signal output terminal for providing an output signal to said external load, comprising:

an output stage, including a first NPN type transistor having a first quiescent collector current, and a first PNP type transistor having a second quiescent collector current, a first NPN type transistor emitter being electrically coupled to a first PNP type transistor emitter, a first NPN type transistor collector being coupled to a first voltage supply source, and a first PNP type transistor collector being coupled to a second voltage supply source;

an input stage, including;

i. a second PNP type transistor and a first current source, a second PNP type transistor emitter being electrically coupled to a first current source output terminal and to said first NPN type transistor base, a second PNP type transistor collector being electrically coupled to said second voltage supply source, a second PNP type transistor base being electrically coupled to said signal input terminal, and a first current source input terminal being electrically coupled to said first voltage supply source;

ii. a second NPN type transistor and a second current source, a second NPN type transistor emitter being electrically coupled to said second current source input terminal and to said first PNP type transistor base, a second NPN type transistor collector being electrically coupled to said first voltage supply source, a second NPN type transistor base being electrically coupled to said signal input terminal, and a second current source output terminal being electrically coupled to said second voltage supply source; and, a control voltage source characterized by a control voltage across the control voltage source and a control current flowing through the control voltage source, wherein said control voltage remains constant for different values of control current, said control voltage source having a positive terminal and a negative terminal, said positive terminal being electrically coupled to said first NPN type transistor base and said negative terminal being electrically coupled to said first PNP type transistor base, wherein said first quiescent collector current and said second quiescent collector current vary as a predetermined function of said control voltage.

8. An apparatus according to claim 7, wherein said predetermined function includes a substantially exponential relationship.

9. An apparatus according to claim 7, wherein said control voltage source includes a resistor, a third PNP type transistor, and a third NPN type transistor, said resistor being electrically coupled between a collector of said third PNP type transistor and a collector of said third NPN type transistor, a base of said third PNP type transistor being electrically coupled to said collector of said third NPN type transistor, a base of said third NPN transistor being electrically coupled to said collector of said third PNP type transistor, an emitter of said third PNP type transistor being electrically coupled to said emitter of said first driver transistor, and an emitter of said third NPN type transistor being electrically coupled to said emitter of said second drive transistor.

10. A buffer stage for buffering and isolating a signal source from an external load, said stage having a signal input terminal for receiving an input signal from said signal source and a signal output terminal for providing an output signal, corresponding to said input signal, to said external load, comprising:

an input section including at least two driver transistors each arranged so as to operate with a predetermined bias current;

at output section including at least two output transistors each arranged so as to operate with a predetermined quiescent current; and a voltage source characterized by a control voltage across the control voltage source and a control current flowing through the control voltage source, wherein said control voltage remains constant for different values of control current, said voltage source being coupled to the input and output sections and constructed and arranged so as to set the quiescent currents flowing through the output transistors substantially independent of the size of the bias current flowing through the driver transistors.

11. A buffer stage according to claim 10, wherein adjusting the voltage provided by the voltage source causes the bias currents through the two driver transistors to be split at different ratios.

12. A buffer stage according to claim 10, wherein the quiescent current through the output transistors is substantially independent of the size of the emitter area of each of the driver transistors so long as the emitter area of each of the driver transistors is smaller than the emitter area of each of the output transistors.

13. A buffer stage according to claim 10, wherein in operation the sum of the output transistor base-emitter voltages is equal to the sum of the driver transistor base-emitter voltages.

14. A buffer stage according to claim 10, wherein in operation the difference current between the bias current and the collector current of each of the driver transistors flows through the voltage source.

15. A buffer stage according to claim 10, wherein the bases of the driver transistors are connected together and form the input of the buffer stage.

16. A buffer stage according to claim 10, wherein the emitters of the output transistors are connected together and form the output of the buffer stage.

17. A buffer stage according to claim 10, further including a current source for providing the bias current through each of the driver transistors.

18. A buffer stage according to claim 10, wherein the emitter of each of the of the driver transistors is coupled to a current source so that at least some of the bias current flows through the driver transistors.

19. A buffer stage according to claim 10 wherein the voltage source is connected between the emitters of the driver transistors, and between the bases of the output transistors.

20. A buffer stage according to claim 10, wherein the output transistors are of an opposite conductivity type.

21. A buffer stage according to claim 10, wherein the voltage source includes two voltage source transistors of an opposite conductivity type, and a resistor connected between the collector of one voltage source transistor and the base of the other voltage source transistor, and between the collector of the other voltage source transistor and the base of the one voltage source transistor.

22. A buffer stage according to claim 10, wherein the bias currents through the driver transistors are equal.

* * * * *